(12) United States Patent
Wang et al.

(10) Patent No.: US 6,876,717 B1
(45) Date of Patent: Apr. 5, 2005

(54) MULTI-STAGE PROGRAMMABLE JOHNSON COUNTER

(75) Inventors: Feng Wang, Portland, OR (US); Keng L. Wong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/922,193

(22) Filed: Aug. 19, 2004

(51) Int. Cl.[7] .............................................. H03K 21/00
(52) U.S. Cl. ....................... 377/47; 377/126; 327/115; 327/117; 327/278; 327/279
(58) Field of Search ................... 377/47, 126; 327/115, 327/117, 278, 279

(56) References Cited

U.S. PATENT DOCUMENTS 5,420,531 A  *  5/1995  Wetlaufer ................... 327/270
5,898,242 A  *  4/1999  Peterson ..................... 327/278

* cited by examiner

*Primary Examiner*—Margaret R. Wambach
(74) *Attorney, Agent, or Firm*—Blakely, Sokoloff, Taylor & Zafman LLP (57) ABSTRACT

A counter has selectable divide factors using multiple multiplexers. The counter includes an inverter and cascading delay stages having selectable stage delays. The inverter connects a stage output of a last one of the delay stages to a stage input of a first one of the delay stages. Each delay stages includes a stage input to receive a quotient signal, at least two paths having different associated path delays each coupled to receive the quotient signal from the stage from the stage input, and a multiplexer. The multiplexer is coupled to selectively communicate the quotient signal from one of the at least two paths to a stage output to select one of the stage delays.

31 Claims, 8 Drawing Sheets

MULTI-STAGE PROGRAMMABLE JOHNSON COUNTER

TECHNICAL FIELD

This disclosure relates generally to high-speed programmable counters, and in particular but not exclusively, relates to Johnson counters.

BACKGROUND INFORMATION

A Johnson counter produces a quotient signal having a quotient frequency $F_{quotient}$ responsive to a reference clock signal having a dividend frequency $F_{dividend}$, such that $F_{quotient}=F_{dividend}/(N*2)$, where N represents a delay measured in cycles of the reference clock signal and (N*2) is a corresponding divide factor.

Johnson counters should have flexible divide factors to produce variable output frequencies. In a known Johnson counter configuration, multiple tap points from a linear shift register having sequential buffers (hereinafter referred as signal or delay buffers) are multiplexed to choose one as feedback in order to select one of multiple possible delays and corresponding divide factors.

Figure 1:
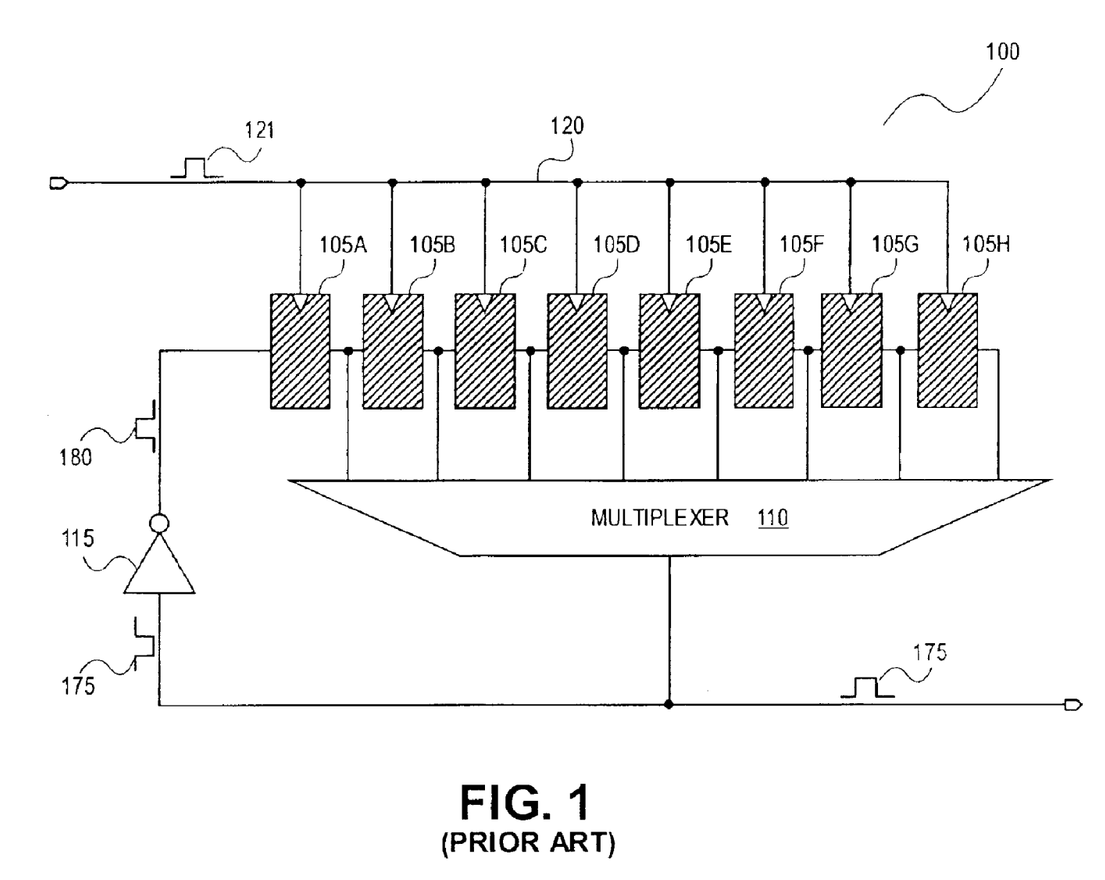
FIG. 1 is a block diagram illustrating a known Johnson counter.

FIG. 1 is a diagram illustrating a known Johnson counter 100 having selectable delays in the range of one through eight (i.e., N=1, 2, 3, 4, 5, 6, 7, 8) and corresponding divide factors in the range of two through sixteen (i.e., N*2=2, 4, 6, 8, 10, 12, 14,16). Johnson counter 100 includes signal buffers 105A, 105B, 105C, 105D, 105E, 105F, 105G, 105H (collectively 105) that are serially coupled to successively delay a quotient signal 175. Each of the signal buffers 105 is further coupled to receive a clock signal 121 via a reference clock distribution network 120 to synchronize the delaying of quotient signal 175. A multiplexer 110 is coupled to multiplex an output from each one of signal buffers 105 to an inverter 115. Inverter 115 inverts quotient signal 175 received from multiplexer 110 and feeds back an inversion 180 of quotient signal 175 to signal buffer 105A.

Multiplexer 110 selects quotient signal 175 output from one of signal buffers 105 to select a delay N between one and eight, inclusive. For example, when multiplexer 110 selects the output from signal buffer 105E, quotient signal 175 is successively delayed through signal buffers 105A, 105B, 105C, 105D, and 105E to arrive at inverter 115. Johnson counter 100 is accordingly set to a delay N of five cycles of reference clock signal 121 (N=5), and a divide factor of ten (N*2=10).

Starting at the input of signal buffer 105A, the first N number of signal buffers 105 successively delays quotient signal 175. After N cycles of reference clock signal 121, quotient signal 175 emerges at the output of multiplexer 110. Inverter 115 inverts quotient signal 175 and sends inversion 180 back to the input of signal buffer 105A. Inversion 180 is successively delayed by the first N number of signal buffers 105 for additional N cycles of clock signal 121. Thus quotient signal 175 is inverted once every N cycles of reference clock signal 121 and each cycle of quotient signal 175 is equal to (N*2) cycles of reference clock signal 121. Therefore, dividend frequency $F_{dividend}$ of reference clock signal 121 is divided down to quotient frequency $F_{quotient}$ of quotient signal 175 by a divide factor of (N*2).

The critical path of Johnson counter 100 is limited by multiplexer 110. The complexity of multiplexer circuits increases with additional selection inputs, resulting in a corresponding performance degradation. Johnson counter 100 requires each signal buffer 105 corresponding to a desired selectable divide factor to be tapped and fed into a corresponding input of multiplexer 110. Thus the size of multiplexer 110 (i.e., the number of inputs on multiplexer 110) corresponds to the desired number of selectable divide factors. Consequently, the number of selectable divide factors is limited by the logic complexity of multiplexer 110. Large numbers result in unacceptable performance degradation, particularly when implemented in high-speed divider applications.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

Embodiments of a system and method for a Johnson counter having multiple delay stages are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
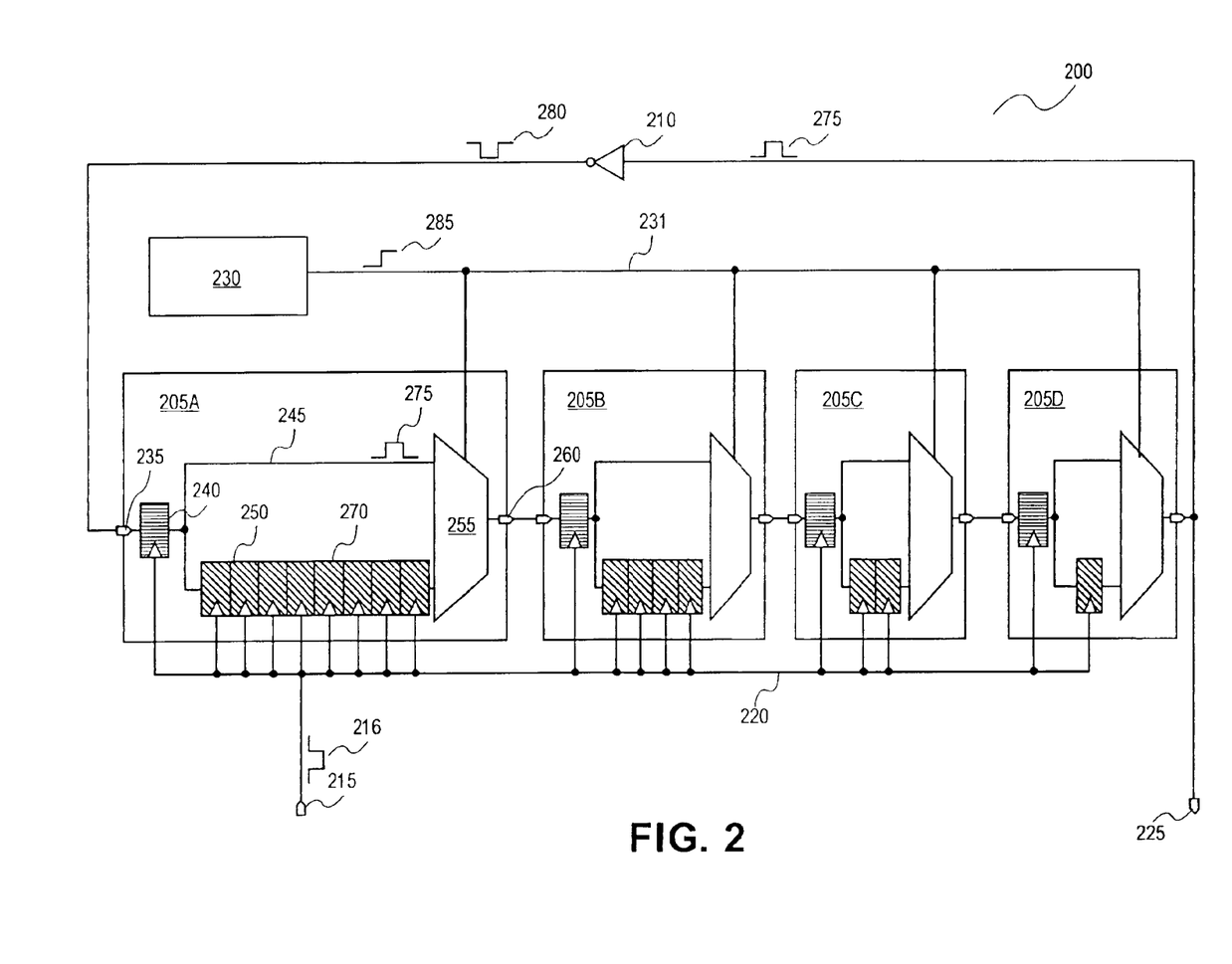
FIG. 2 is a block diagram illustrating a Johnson counter having multiple delay stages, in accordance with an embodiment of the present invention.

FIG. 2 is a block diagram illustrating a Johnson counter 200, in accordance with an embodiment of the present invention. The illustrated embodiment of Johnson counter 200 includes cascading delay stages 205A, 205B, 205C, 205D (collectively 205), an inverter 210, a reference clock input 215, a reference clock distribution network 220, a counter output 225, and a control circuit 230. It should be appreciated that Johnson counter 200 may include more or less delay stages 205 than those illustrated in FIG. 2, and the serial order of delay stages 205 does not impact the functionality or performance of Johnson counter 200.

Delay stages 205 each include a stage input 235, an input buffer 240, multiple paths (e.g., a shunt path 245 and a delay path 250), a multiplexer 255, and a stage output 260. Only the components of delay stage 205A have been labeled so as not to clutter FIG. 2. It should be appreciated that each of delay stages 205 may include additional paths as described below.

In one embodiment, each delay path 250 has at least one signal buffer 270. In one embodiment, the number of signal buffers 270 in delay path 250 of each one of delay stages 205 is a unique integral power of two. For example, delay path 250 in each of delay stages 205A, 205B, 205C, and 205D may include eight (i.e., $2^3$), four (i.e., $2^2$), two (i.e., $2^1$), and one (i.e., $2^0$) signal buffers 270, respectively.

In one embodiment, each signal buffer 270 and input buffer 240 includes a flip-flop circuit to delay a quotient signal 275 for one cycle of a reference clock signal 216. In another embodiment, each signal buffer 270 and input buffer 240 includes a D-type flip-flop circuit.

The components of Johnson counter 200 are connected as follows. Delay stages 205 are serially coupled to successively delay quotient signal 275. Each one of delay stages 205 receives reference clock signal 216 from reference clock input 215 via reference clock distribution network 220. Inverter 210 is coupled to receive quotient signal 275 from stage output 260 of a last one of delay stages 205 (e.g., delay stage 205D). Inverter 210 is further coupled to send an inversion 280 of quotient signal 275 back to stage input 235 of a first one of delay stages 205 (e.g., delay stage 205A). Counter output 225 is coupled to stage output 260 of delay stage 205D to tap quotient signal 275 for output.

The components of delay stages 205 are coupled as follows. Input buffer 240 is coupled to receive quotient signal 275 from stage input 235. Multiple paths connect the output of input buffer 240 to a corresponding input of multiplexer 255 (e.g., shunt path 245 connects the output of input buffer 240 to a first input of multiplexer 255 and delay path 250 connects the output of input buffer 240 to a second input of multiplexer 255). Multiplexer 255 is coupled to receive control signal 285 from control circuit 230 via a control bus 231. Multiplexer 255 is coupled to selectively send quotient signal 275 received from one of the multiple paths (e.g., shunt path 245 and delay path 250) to stage output 260, responsive to control signal 285.

The processes explained below are described in terms of computer software and hardware. The processes may be embodied within hardware, such as an application specific integrated circuit ("ASIC") or the like. The order in which some or all of the process blocks appear in each process should not be deemed limiting. Rather, one of ordinary skill in the art having the benefit of the present disclosure will understand that some of the process blocks may be executed in a variety of orders not illustrated.

Figure 3:
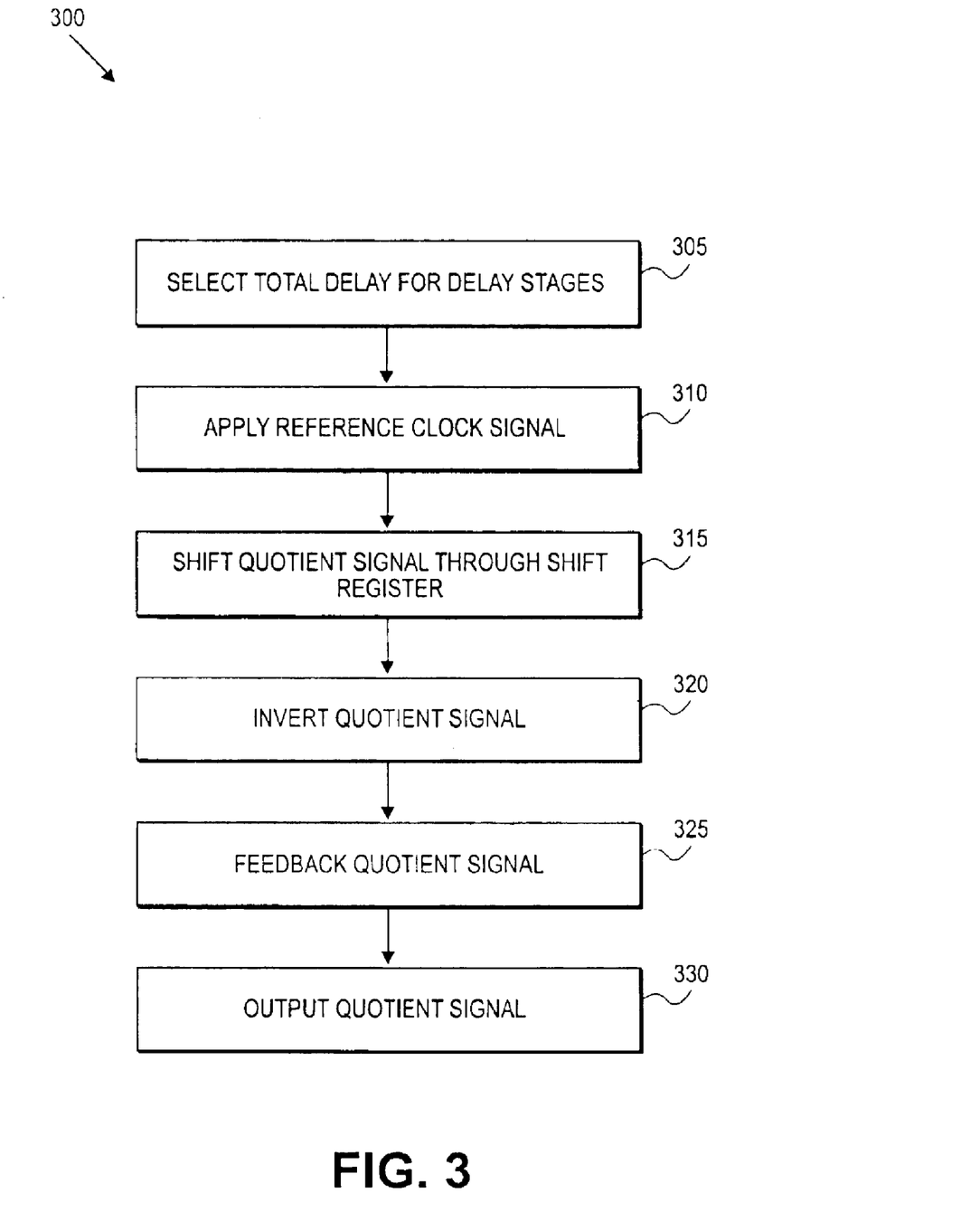
FIG. 3 is a flow chart illustrating a process for operating a Johnson counter, in accordance with an embodiment of the present invention.

FIG. 3 is a flow chart illustrating a process 300 for operating Johnson counter 200, in accordance with an embodiment of the present invention.

In a process block 305, a total delay N is selected for delay stages 205 by appropriately selecting one of at least two delays associated with each of delay stages 205. In one embodiment, control signal 285 is asserted to cause multiplexer 255 in each of delay stages 205 to respectively select one of shunt path 245 and delay path 250 in order to select one of two delays associated with each one of delay stages 205.

In one embodiment, each one of delay stages 205 may be set to delay quotient signal 275 for one cycle of reference clock signal 216 by asserting control signal 285 to cause multiplexer 255 to select shunt path 245. Starting at stage input 235, quotient signal 275 is delayed through input buffer 240 for one cycle of reference clock signal 216, and subsequently passes through shunt path 245 and multiplexer 255 to emerge at stage output 260.

In the illustrated embodiment, delay stages 205 may be set to delay quotient signal 275 for a number of cycles of reference clock signal 216 corresponding to the number of signal buffers in delay path 250 plus one (due to input buffer 240) by asserting control signals 285 to cause multiplexer 255 to select delay path 250. In each of delay stages 205, input buffer 240 delays quotient signal 275 for one cycle of reference clock signal 216. Delay path 250 further delays quotient signal 275 for a number of cycles of reference clock signal 216 corresponding to the number of signal buffers 270 in the particular delay path 250. For example, delay path 250 in delay stages 205A, 205B, 205C, and 205D further delays quotient signal 275 for eight, four, two, and one cycle of reference clock signal 216, respectively. Therefore, including input buffer 240, each of delay stage 205 is set to delay quotient signal 275 for a total of nine, five, three, and two cycles of reference clock signal 216, respectively.

The selectable delays of each delay stage 205 can be combined to obtain a total delay N in the range of four to nineteen cycles of reference clock signal 216, and a corresponding divide factor (N*2) in the range of eight to thirty-eight, as enumerated in Table 1. Each row of Table 1 illustrates a total delay N and divide factor (N*2) obtained by a corresponding selectable delay combination for delay stages 205. For example, in row number seven, delay stages 205A, 205B, 205C, and 205D are selected to delay quotient signal 275 for one, five, three, and one cycle of reference clock signal 216 by respectively selecting shunt path 245 for delay stages 205A and 205D and delay path 250 for delay stages 205B and 205C. Accordingly the total delay N for delay stages 205 is equal to ten cycles of reference clock signal 216 (i.e., N=1+5+3+1=10) and the corresponding divide factor is twenty (i.e., N*2=10*2=20).

TABLE 1

| Row No. | 205A | 205B | 205C | 205D | Total delay N | Divide Factor |
|---|---|---|---|---|---|---|
| 1 | 1 | 1 | 1 | 1 | 4 | 8 |
| 2 | 1 | 1 | 1 | 2 | 5 | 10 |
| 3 | 1 | 1 | 3 | 1 | 6 | 12 |
| 4 | 1 | 1 | 3 | 2 | 7 | 14 |
| 5 | 1 | 5 | 1 | 1 | 8 | 16 |
| 6 | 1 | 5 | 1 | 2 | 9 | 18 |
| 7 | 1 | 5 | 3 | 1 | 10 | 20 |
| 8 | 1 | 5 | 3 | 2 | 11 | 22 |
| 9 | 9 | 1 | 1 | 1 | 12 | 24 |
| 10 | 9 | 1 | 1 | 2 | 13 | 26 |
| 11 | 9 | 1 | 3 | 1 | 14 | 28 |
| 12 | 9 | 1 | 3 | 2 | 15 | 30 |
| 13 | 9 | 5 | 1 | 1 | 16 | 32 |
| 14 | 9 | 5 | 1 | 2 | 17 | 34 |

TABLE 1-continued

| Row No. | 205A | 205B | 205C | 205D | Total delay N | Divide Factor |
| --- | --- | --- | --- | --- | --- | --- |
| 15 | 9 | 5 | 3 | 1 | 18 | 36 |
| 16 | 9 | 5 | 3 | 2 | 19 | 38 |

Although the illustrated embodiment of Johnson counter 200 provides for sixteen selectable divide factors using two-to-one multiplexers, it should be appreciated that the range of selectable divide factors may be extended by incorporating additional delay stages 205. Table 2 illustrates the maximum and minimum total delays N and corresponding divide factors (N*2) for various configurations of Johnson counters 200 having different number of delay stages 205. Each row of Table 2 represents a configuration of Johnson counter 200 having a particular number of delay stages 205 designated by P in the left column. It should be noted that for any particular configuration of Johnson counter 200, the number of signal buffers 270 in delay path 250 of delay stages 205 may be consecutive integral powers of two (e.g., 1, 2, 4, 8, 16, 32, etc.). $N_{min}$ and $(N*2)_{min}$ respectively represent the minimum total delay and the minimum divide factor. $N_{max}$ and $(N*2)_{max}$ represent the maximum total delay and the maximum divide factor.

TABLE 2

| P | $N_{min}$ | $(N*2)_{min}$ | $N_{max}$ | $(N*2)_{max}$ |
| --- | --- | --- | --- | --- |
| 1 | 1 | 2 | 2 | 4 |
| 2 | 2 | 4 | 5 | 10 |
| 3 | 3 | 6 | 10 | 20 |
| 4 | 4 | 8 | 19 | 38 |
| 5 | 5 | 10 | 36 | 72 |

For example, row 4 represents a Johnson counter 200 having four delay stages 205 (i.e., P=4) corresponding to the illustrated embodiment in FIG. 2. The number of signal buffers 270 in delay paths 250 of the four delay stages 205 are consecutive integral powers of two (e.g., delay paths 205 respectively have one, two, four, and eight signal buffers 270). The minimum total delay $N_{min}$ is four and the corresponding minimum divide factor $(N*2)_{min}$ is eight. The maximum total delay $N_{max}$ is nineteen and the corresponding maximum divide factor $(N*2)_{max}$ is thirty-eight. It should be appreciated that adding additional delay stages 205 allows the maximum total delay $N_{max}$ and corresponding maximum divide factors $(N*2)_{max}$ to expand exponentially while accompanied with only linear growth in the minimum total delay $N_{min}$ and corresponding minimum divide factors $(N*2)_{min}$.

It should be appreciated that adding one or more delay stages 205 does not increase the complexity (i.e., fan-in) of multiplexers 255. Therefore, Johnson counter 200 can be extended to obtain a larger range of divide factors simply by incorporating additional delay stages 205 without substantially degrading the performance of Johnson counter 200.

In a process block 310, reference clock signal 216 is applied to delay stages 205. Once reference clock signal 216 is applied, quotient signal 275 is successively delayed through delay stages 205 clocked by reference clock signal 216 (process block 315). Quotient signal 275 enters each one of delay stages 205 at stage input 235. Input buffer 240 delays quotient signal 275 for one cycle of reference clock signal 216. Shunt path 245 delivers quotient signal 275 from input buffer 240 to a first input of multiplexer 255 substantially without delay. Delay path 250 delays quotient signal 275 for a number of cycles of reference clock signal 216 corresponding to the number of signal buffers 270 in the particular delay path 250 and delivers quotient signal 275 to a second input of multiplexer 255. Multiplexer 255 sends quotient signal 275 from the selected one of shunt path 245 and delay path 250 to stage output 260 to be received by a next stage input 235. Quotient signal 275 is delayed for a total of N cycles of reference clock signal 216 from stage input 235 of delay stage 205A to stage output 260 of delay stage 205D, where N is the total delay selected for delay stages 205 in process block 305.

In a process block 320, quotient signal 275 output from stage output 260 of a last one of cascading delay stages 205 (e.g., 205D) is inverted by inverter 210 to obtain inversion 280. Since quotient signal 275 is delayed for N cycles of reference clock signal 216 via delay stages 205, quotient signal 275 is inverted once every N cycles of reference clock signal 216.

In a process block 325, inversion 280 of quotient signal 275 is fed back into stage input 235 of delay stage 205A. In a process block 330, quotient signal 275 output from delay stage 205D is tapped to produce a square wave having a quotient frequency $F_{quotient}=F_{dividend}/(N*2)$, where $F_{dividend}$ is the frequency of reference clock signal 216.

Figure 4:
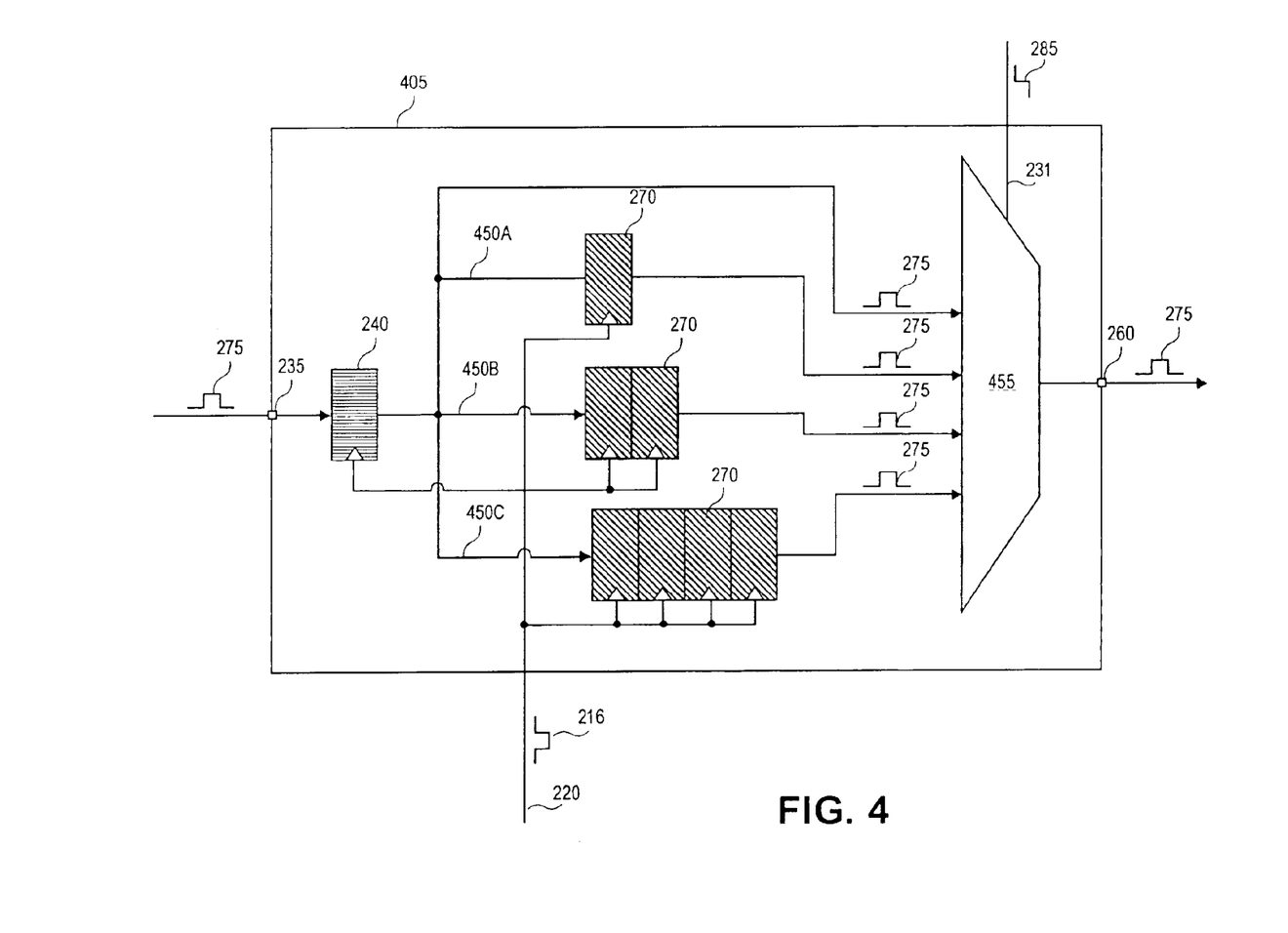
FIG. 4 is a block diagram illustrating a delay stage of a Johnson counter, in accordance with an embodiment of the present invention.

FIG. 4 is a block diagram illustrating an alternative delay stage 405 for use with Johnson counter 200, in accordance with an embodiment of the present invention. Delay stage 405 includes a stage input 235, an input buffer 240, a shunt path 245, delay paths 450A, 450B, 450C (collectively 450), a 4-to-1 multiplexer 455, and a stage output 260.

In the illustrated embodiment, delay paths 450 respectively include one, two and four signal buffers 270. In one embodiment, each signal buffer 270 and input buffer 240 respectively contains a flip-flop circuit. It should be appreciated that each delay path 450 may include more or less signal buffers 270 to specially tailor delay stage 405 for a particular implementation and to obtain a desired total delay combination.

The components of delay stage 405 are coupled as follows. Input buffer 240 is coupled to receive quotient signal 275 from stage input 235. Shunt path 245 connects the output of input buffer 240 to a first input of multiplexer 455. Delay paths 450 further connect the output of input buffer 240 to a second, third, and fourth input of multiplexer 455, respectively. Multiplexer 455 is further coupled to selectively send quotient signal 275 received from one of shunt path 445 and delay paths 450 to stage output 260 in response to control signal 285 received from control bus 231.

Figure 5:
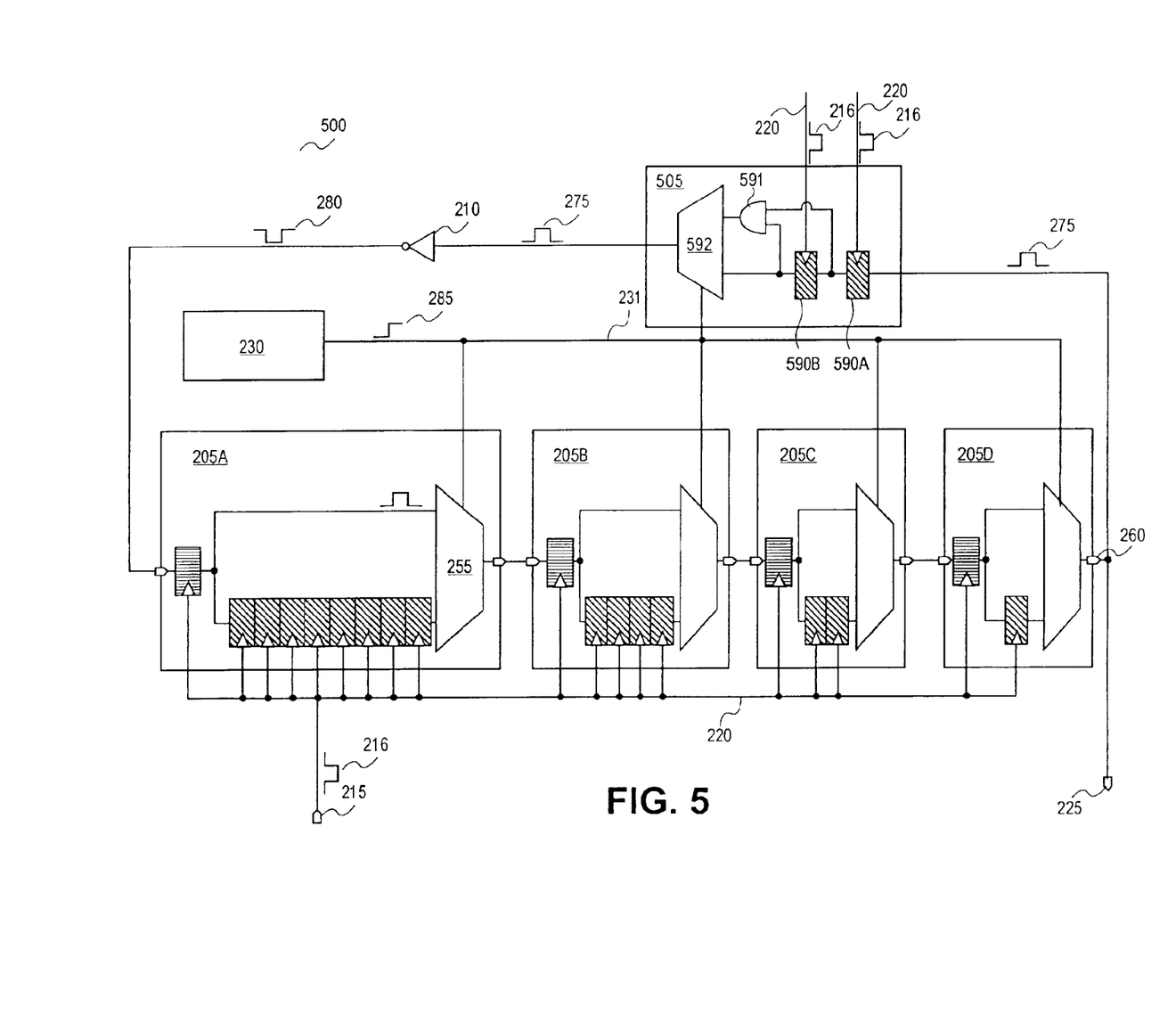
FIG. 5 is a block diagram illustrating a Johnson counter having a selection stage to choose odd valued divide factors, in accordance with an embodiment of the present invention.

FIG. 5 is a block diagram illustrating a Johnson counter 500, in accordance with an embodiment of the present invention. Johnson counter 500 is substantially the same as Johnson counter 200, except that Johnson counter 500 further includes a selection stage 505 coupled between the stage output 260 of a last one of delay stages 205 (e.g., delay stage 205D) and the input of inverter 210 for selecting odd valued divide factors.

In the illustrated embodiment, selection stage 505 includes signal buffers 590A and 590B (collectively 590) serially coupled to successively delay quotient signal 275 received from delay stage 205D. The output from signal buffers 590 respectively feed into an AND gate 591. Multiplexer 592 multiplexes the outputs of AND gate 591 and signal buffer 590B for input to inverter 210, responsive to control signal 285 received via control bus 231. In one embodiment, each signal buffer 590 includes a flip-flop circuit to delay quotient signal 275 for one cycle of reference clock signal 216 received via reference clock distribution network 220.

Asserting multiplexer 592 to select the output of signal buffer 590B causes inverter 210 to invert quotient signal 275 once every (N+2) cycles of reference clock signal 216, where N is the total delay of delay stages 205, and the additional two delay cycles are attributed to signal buffers 590. Thus when selecting the output of signal buffer 590B, each cycle of quotient signal 275 takes (2*N+4) cycles of reference clock signal 216. It should be noted that the divide factor (2*N+4) is an even valued integer.

Asserting multiplexer 592 to select the output of AND gate 591 causes inverter 210 to invert quotient signal 275 once every N' cycles of reference clock signal 216, where N' alternates between N+2 and N+1. Thus each complete cycle of quotient signal 275 takes (N+2+N+1=2*N+3) cycles of reference clock signal 216. It should be noted that divide factor (2*N+3) is an odd valued integer.

Figure 6:
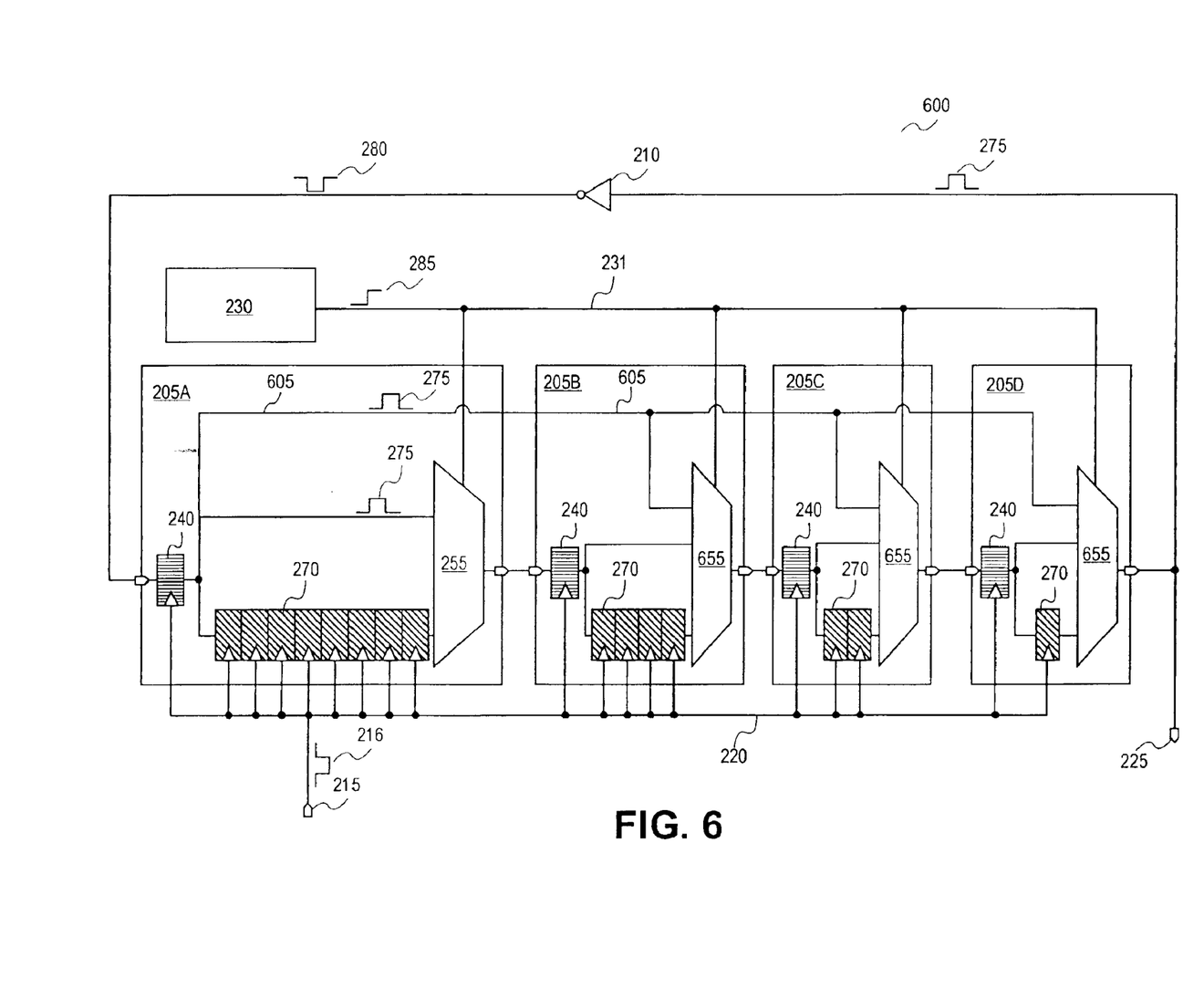
FIG. 6 is a block diagram illustrating a Johnson counter having a skip-ahead path to extend the selection range of total delays and corresponding divide factors, in accordance with an embodiment of the present invention.

FIG. 6 is a block diagram illustrating a Johnson counter 600, in accordance with an embodiment of the present invention. Johnson counter 600 is substantially the same as Johnson counter 200, except that Johnson counter 600 further includes a skip-ahead path 605 to deliver quotient signal 275 from input buffer 240 of delay stage 205A to an additional input on multiplexer 655 in delay stages 205B, 205C, and 205D. Multiplexer 655 and multiplexer 255 are substantially the same, except multiplexer 655 has a three to one fan-in ratio. Skip-ahead path 605 enables quotient signal 275 to selectively bypass input buffers 240 and signal buffers 270 in subsequent delay stages 205B, 205C, and 205D. Thus the minimum total delay N of delay stages 205 is extended down from four to one. Accordingly, the minimum divide factor (N*2) is extended down from eight to two.

Figure 7:
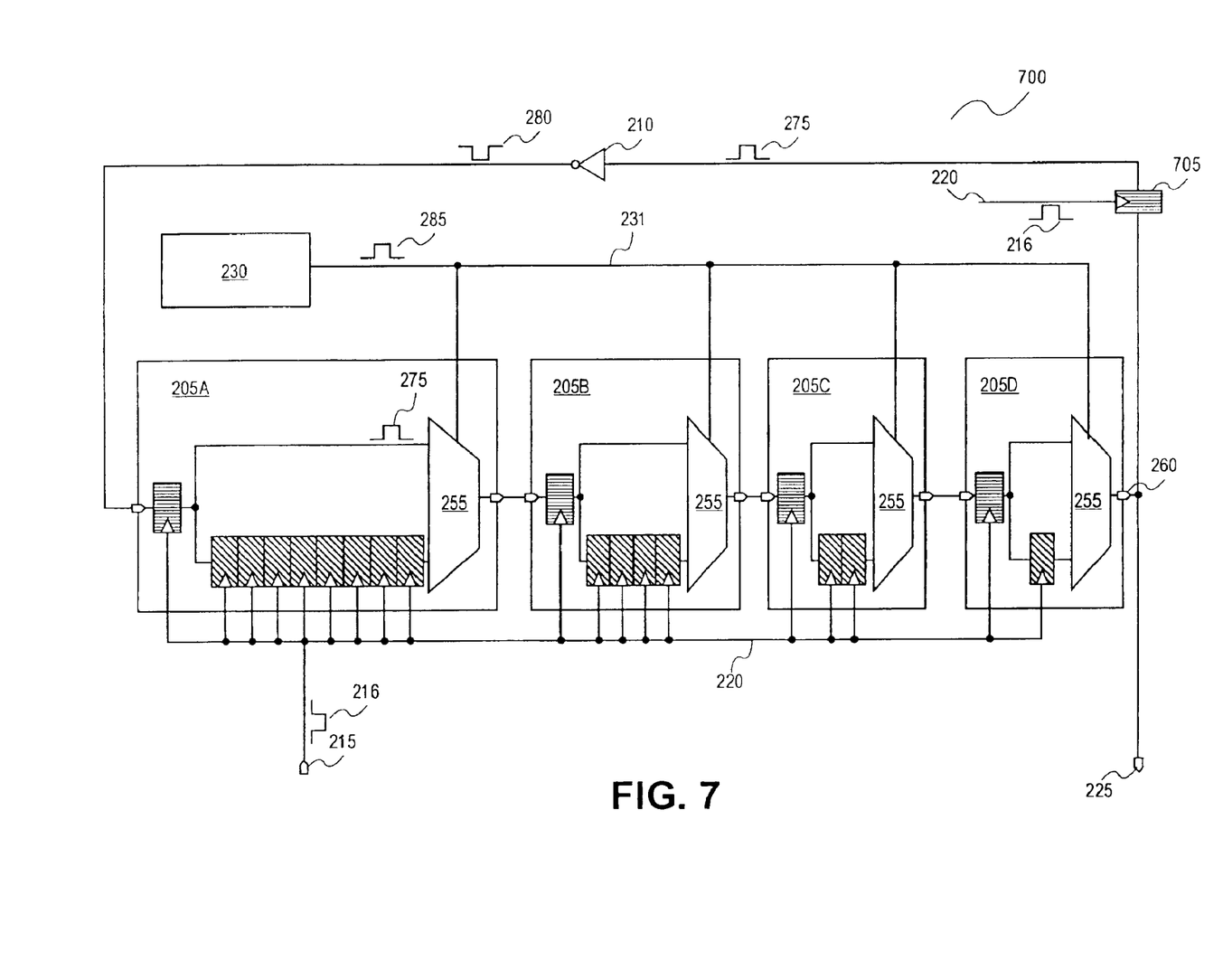
FIG. 7 is a block diagram illustrating a Johnson counter having an output buffer to minimize propagation latency, in accordance with an embodiment of the present invention.

FIG. 7 is a block diagram illustrating a Johnson counter 700, in accordance with an embodiment of the present invention. Johnson counter 700 is substantially the same as Johnson counter 200, except that Johnson counter 700 further includes an output buffer 705 coupled between stage output 260 of a last one of delay stages 205 (e.g., delay stage 205D) and the input of inverter 210 to further delay quotient signal 275.

Referring back to FIG. 2, it should be appreciated that since the multiplexer 255 of delay stage 205D and inverter 210 are coupled in series, the critical path of Johnson counter 200 is the sum of the propagation latency of multiplexer 255 in delay stage 205D and inverter 210. In the embodiment illustrated in FIG. 7, output buffer 705 decouples inverter 210 from the multiplexer 255 of delay sage 205D. Therefore the critical path includes output buffer 705 and inverter 210, or a buffer element (e.g., input buffer 240, output buffer 705, or signal buffer 270) and any multiplexer 255. In practice, the propagation latency of a 2-to-1 multiplexer is similar to an inverter. Thus multiplexers 255 in the illustrated embodiment do not limit the performance of Johnson counter 700.

Figure 8:
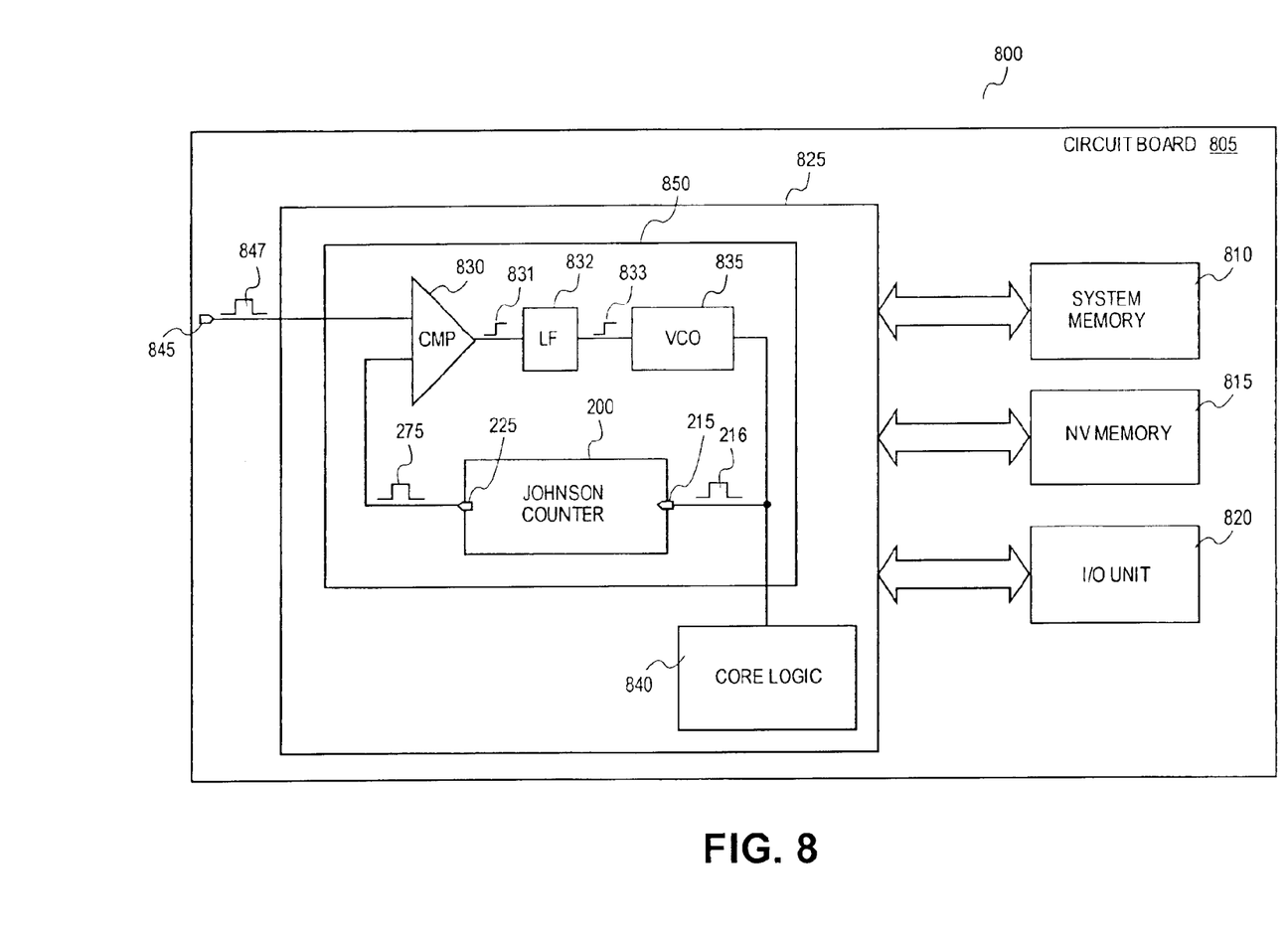
FIG. 8 is a block diagram illustrating a demonstrative processing system for implementing embodiments of the present invention.

FIG. 8 is a block diagram illustrating a demonstrative processing system 800 for implementing embodiments of the present invention. The illustrated embodiment of system 800 includes a circuit board 805 populated with appropriate integrated circuits including system memory 810, nonvolatile ("NV") memory 815, an I/O unit 820, and a processor 825. Processor 825 includes a phase-frequency comparator ("CMP") 830, a loop filter ("LF") 832, a voltage controlled oscillator ("VCO") 835, core logic 840, an external clock port 845, and Johnson counter 200.

In the illustrated embodiment, Johnson counter 200, CMP 830, LF 832, and VCO 835 are coupled in a phase locked loop ("PLL") configuration 850. A first input of CMP 830 is coupled to external clock port 845 to receive an external clock signal 847 having an external clock frequency $F_{ext}$. A second input of CMP 830 is coupled to counter output 225 of Johnson counter 200 to receive quotient signal 275 having a quotient frequency $F_{quotient}$. CMP 830 compares external clock frequency $F_{ext}$ with quotient frequency $F_{quotient}$ to generate a control voltage 831. LF 832 is coupled to receive control voltage 831 generated by CMP 830 and to output a filtered control voltage 833. The input of VCO 835 is coupled to receive filtered control voltage 833 output from LF 832 and to generate reference clock signal 216 having the dividend frequency $F_{dividend}$. Johnson counter 200 is coupled to receive reference clock signal 216 output from VCO 835 via reference clock input 215. Quotient signal 275 produced by Johnson counter 200 is phase and frequency aligned to external clock signal 847 having external clock frequency $F_{ext}$. Thus, Johnson counter 200 locks dividend frequency $F_{dividend}$ and external frequency $F_{ext}$ to a ratio equal to the divide factor (i.e., $F_{dividend}/F_{ext}=N*2$).

In the illustrated embodiment, the output of VCO 830 is further coupled to deliver reference clock signal 216 having dividend frequency $F_{dividend}$ to core logic 840 to synchronize its operation. In one embodiment, core logic 840 may include various processor components such as data registers, instruction decoders, an arithmetic logic unit, and the like.

In the illustrated embodiment, processor 825 is communicatively coupled to system memory 510, NV memory 815, and I/O unit 820 to send and to receive instructions or data thereto/therefrom. In one embodiment, NV memory 815 is a flash memory device. In other embodiments, NV memory 815 includes any one of read only memory ("ROM"), programmable ROM, erasable programmable ROM, electrically erasable programmable ROM, or the like. In one embodiment, system memory 510 includes random access memory ("RAM"), such as dynamic RAM ("DRAM"), synchronous DRAM, ("SDRAM"), double data rate SDRAM ("DDR SDRAM"), static RAM ("SRAM"), and the like.

It should be appreciated that various other elements of processing system 800 have been excluded from FIG. 8 and this discussion for the purposes of clarity. For example, processing system 800 may further include a graphics card, additional processors, a persistent data storage device (e.g., hard disk drive), and the like. Circuit board 805 may also include a system bus and various other data buses for interconnecting subcomponents, such as a memory controller hub and an input/output controller hub, as well as, include data buses (e.g., peripheral component interconnect bus) for connecting peripheral devices to processor 825. Correspondingly, processing system 800 may operate without one or more of the elements illustrated. For example, processing system 800 need not include I/O unit 820.

It should be appreciated that the embodiments disclosed above may be embodied within a physical apparatus or system, as well as, embodied within a machine-readable medium (e.g., hard disk, CD-ROM, or other portable media) having stored thereon one or more descriptions of the above embodiments, or portions thereof. These descriptions may include behavioral level code describing the operations of the above embodiments using hardware descriptive languages, such as VHDL or Verilog. Alternatively, the descriptions may include register transfer level ("RTL") code, a netlist, or even a circuit layout of Johnson counter 200, or portions thereof. The behavioral level code, the RTL code, the netlist, and the circuit layout all represent various levels of abstraction that may be used to describe the above embodiments of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
    cascading delay stages having selectable stage delays, each of the delay stages including:
        a stage input to receive a quotient signal;
        at least two paths having different associated path delays each coupled to receive the quotient signal from the stage input; and
        a multiplexer coupled to selectively communicate the quotient signal from one of the at least two paths to a stage output to select one of the stage delays; and
    an inverter connecting the stage output of a last one of the delay stages to the stage input of a first one of the delay stages.

2. The apparatus of claim 1, wherein the cascading delay stages and the inverter are coupled to comprise a Johnson counter.

3. The apparatus of claim 1, further comprising a reference clock distribution network coupled to distribute a reference clock signal having a dividend frequency to each of the delay stages, and wherein the delay quotient frequency equal to the dividend frequency divided by N*2, where stages are serially coupled to generate the quotient signal having a N represents a total delay comprising all the selectable stage delays.

4. The apparatus of claim 1, further comprising a control circuit coupled to the multiplexer of each of the delay stages to select one of the at least two paths from which to communicate the quotient signal to the stage output.

5. The apparatus of claim 1, wherein each of the delay stages further comprises an input buffer coupled between the stage input and the at least two paths to further delay the quotient signal.

6. The apparatus of claim 1, wherein the at least two paths of each of the delay stages include a shunt path.

7. The apparatus of claim 6, wherein the at least two paths of each of the delay stages further include a delay path having at least one signal buffer to further delay the quotient signal.

8. The apparatus of claim 7, the delay path of each of the delay stages has a unique number of signal buffers.

9. The apparatus of claim 8, wherein the number of the signal buffers in the delay path of each of the delay stages is an integral power of two.

10. The apparatus of claim 9, wherein the signal buffers comprises flip-flop circuits.

11. The apparatus of claim 1, further comprising an output buffer coupled between the stage output of the last one of the cascading delay stages and the inverter to decouple the inverter from the multiplexer of the last one of the cascading delay stages.

12. The apparatus of claim 1, wherein the multiplexer of at least one of the cascading delay stages is further coupled to selectively communicate the quotient signal from one of the at least two paths and a skip-ahead path to the stage output coupled to the multiplexer, the skip-ahead path is coupled to receive the quotient signal from the stage input of the first one of the cascading delay stages.

13. The apparatus of claim 1, further comprising a selection stage coupled between the stage output of the last one of the cascading delay stages and the inverter, the selection stage including:
    a first signal buffer coupled to delay the quotient signal received from the stage output of the last one of the cascading delay stages;
    a second signal buffer coupled in series with the first signal buffer to further delay the quotient signal;
    an AND logic gate coupled to receive the quotient signal output from the first and second signal buffers; and
    a multiplexer coupled to selectively communicate the quotient signal output from the AND gate and the second signal buffer to the inverter.

14. A method comprising:
    selecting one of at least two delays associated with each of multiple cascading delay stages coupled in series to select a total delay for the multiple cascading delay stages;
    clocking the cascading delay stages with a reference clock signal;
    delaying a quotient signal through the cascading delay stages;
    inverting the quotient signal output from a last one of the cascading delay stages once every N cycles of the reference clock signal, where N is a positive integer dependent upon the total delay; and
    feeding back the inverted quotient signal to a first one of the cascading delay stages.

15. The method of claim 14, wherein selecting one of at least two delays associated with each of the cascading delay stages comprises activating a multiplexer to select one of at least two paths in each of the cascading delay stages.

16. The method of claim 15, wherein delaying the quotient signal through each of the cascading delay stages comprises:
    receiving the quotient signal at a stage input;
    delaying the quotient signal through each of the at least two paths; and
    communicating the quotient signal from one of the at least two paths selected by the multiplexer to a stage output.

17. The method of claim 16, wherein delaying the quotient signal through each of the cascading delay stages further comprises delaying the quotient signal through an input buffer to further delay the quotient signal.

18. The method of claim 14, further comprising:
    comparing the quotient frequency with an external clock frequency to generate a control voltage; and
    generating the reference clock signal having a dividend frequency dependent upon the control voltage.

19. The method of claim 18, further comprising clocking a core logic of a processor with the reference clock signal.

20. A machine-accessible medium having contained thereon a description of an integrated circuit, the integrated circuit comprising:

cascading delay stages, each of the delay stages including:
- at least two paths having different associated path delays each coupled to an input buffer to delay a quotient signal received from a stage input; and
- a multiplexer coupled to the at least two paths to selectively communicate the quotient signal from one of the at least two paths to a stage output; and
- an inverter coupled to receive the quotient signal from the stage output of a last one of the cascading delay stages and coupled to feed back an inversion of the quotient signal to the stage input of a first one of the cascading delay stages.

21. The machine-accessible medium of claim 20, wherein the integrated circuit further comprises a clock distribution network to distribute a reference clock signal having a dividend frequency to each of the delay stages, and wherein the delay stages are serially coupled to generate the quotient signal having a quotient frequency equal to the dividend frequency divided by N*2, where N represents a total delay comprising all the cascading delay stages.

22. The machine-accessible medium of claim 20, wherein the at least two paths of each of the delay stages include a shunt path.

23. The machine-accessible medium of claim 22, wherein the at least two paths of each of the delay stages further include a delay path having at least one signal buffer to further delay the quotient signal.

24. The machine-accessible medium of claim 23, wherein the number of signal buffers in the delay path of each of the delay stages is a unique integral power of two.

25. A system comprising:
- a motherboard;
- synchronous dynamic random access memory ("SDRAM") disposed on the motherboard; and
- a processor disposed on the motherboard and communicatively coupled to the SORAM, the processor including:
  - cascading delay stages, each of the delay stages including:
    - at least two paths having different associated path delays each coupled to an input buffer to delay a quotient signal received from a stage input; and
    - a multiplexer coupled to the at least two paths to selectively communicate the quotient signal from one of the paths to a stage output; and
    - an inverter coupled to receive the quotient signal from the stage output of a last one of the delay stages and coupled to output an inversion of the quotient signal to the stage input of a first one of the delay stages.

26. The system of claim 25, wherein the processor further comprises a reference clock distribution network coupled to distribute a reference clock signal having a dividend frequency to each of the delay stages, and wherein the delay stages are serially coupled to generate the quotient signal having a quotient frequency equal to the dividend frequency divided by N*2, where N represents a total delay comprising all of the cascading delay stages.

27. The system of claim 26, wherein the at least two paths of each of the delay stages include a shunt path.

28. The system of claim 27, wherein the at least two paths of each of the delay stages further include a delay path having at least one signal buffer to further delay the quotient signal.

29. The system of claim 28, wherein the number of signal buffers in the delay path of each of the delay stages is an unique integral power of two.

30. The system of claim 29, wherein the processor further comprises a phase locked loop ("PLL"), the PLL including:
- an external clock port coupled to receive an external clock signal having an external clock frequency;
- a frequency comparator coupled to generate a control voltage responsive to a difference between the quotient frequency and the external clock frequency; and
- a voltage controlled oscillator coupled to generate the reference clock signal in response to the control voltage.

31. The system of claim 30, wherein the processor further comprises a core logic coupled to receive the reference clock signal.

* * * * *

UNITED STATES PATENT AND TRADEMARK OFFICE
CERTIFICATE OF CORRECTION

PATENT NO. : 6,876,717 B1
DATED : April 5, 2005
INVENTOR(S) : Wang et al.

It is certified that error appears in the above-identified patent and that said Letters Patent is hereby corrected as shown below:

Column 9,
Lines 40-44, after "delay", delete "quotient frequency equal to the dividend frequency divided by N*2, where stages are serially coupled to generate the quotient signal having a N represents a total delay comprising all the selectable stage delays" and insert -- stages are serially coupled to generate the quotient signal having a quotient frequency equal to the dividend frequency divided by N*2, where N represents a total delay comprising all the selectable stage delays. --.

Column 11,
Line 37, delete "SORAM" and insert -- SDRAM --.

Signed and Sealed this

Fifth Day of July, 2005

JON W. DUDAS
*Director of the United States Patent and Trademark Office*